United States Patent [19]

Scarra et al.

[11] Patent Number: 5,274,282
[45] Date of Patent: Dec. 28, 1993

[54] MONOSTABILIZED DYNAMIC PROGRAMMABLE LOGIC ARRAY IN CMOS TECHNOLOGY

[75] Inventors: Flavio Scarra, Agrate Brianza; Siro M. Morganti, Trezzo Sull'adda; Giuseppe Meroni, Agrate Brianza, all of Italy

[73] Assignee: SGS-Thomson Microelectronics, S.R.L., Agrate Brianza, Italy

[21] Appl. No.: 970,609

[22] Filed: Oct. 30, 1992

Related U.S. Application Data

[63] Continuation of Ser. No. 767,141, Sep. 27, 1991, abandoned.

[30] Foreign Application Priority Data

Oct. 2, 1990 [IT] Italy ............... 21626 A/90

[51] Int. Cl.⁵ ............... H03K 19/173; H03K 19/094
[52] U.S. Cl. ............... 307/465; 307/469; 307/451
[58] Field of Search ............... 307/451, 465, 465.1, 307/469

[56] References Cited

U.S. PATENT DOCUMENTS

| | | | |
|---|---|---|---|
| 4,611,133 | 9/1986 | Peterson et al. | 307/465 |
| 4,661,728 | 4/1987 | Kashimura | 307/468 |
| 4,769,562 | 9/1988 | Ghisio | 307/465 |
| 4,952,824 | 8/1990 | Kamuro | 307/465 |
| 5,021,690 | 6/1991 | Linz | 307/465 |
| 5,101,122 | 3/1992 | Shinonara | 307/465 |

FOREIGN PATENT DOCUMENTS

0132071 1/1985 European Pat. Off. .
58-123230 7/1983 Japan .

OTHER PUBLICATIONS

Kraft et al., "OR Array Reduction Techniques," vol. 23, No. 8 IBM Tech. Disclo. Bull. (Jan. 1981) pp. 3533-3534.

Primary Examiner—Edward P. Westin
Assistant Examiner—Richard Roseen

[57] ABSTRACT

The circuit includes an input register (RI); an output register (RU); an AND plane; and an OR plane. The AND plane has vertical lines (Y), which are controlled by the input register, and horizontal lines (L), which include transistors (TA) arranged in series and controlled by respective vertical lines. The horizontal lines are connected to ground by normally-off transistors (TV) and to the power supply by normally-on transistors (TP). These transistors (TV, TP) are controlled by a first clock signal (CK1~). The OR plane has horizontal lines (S) and vertical lines (U). The vertical lines (U) of the OR plane contain normally-off transistors (TO) which are controlled by respective horizontal lines of the OR plane. Horizontal lines of the AND plane and horizontal lines of the OR plane are connected by respective pairs of normally-on transistors (TB) and normally-off transistors (TC) arranged in series between the power supply and ground. In each pair, the normally-on transistor is controlled by a horizontal line of the AND plane, and the normally-off transistor is controlled by a second clock signal (CK2). A horizontal line of the OR plane is connected to the node between the pair. The vertical lines of the OR plane are connected to the power supply by respective transistors (TR), which are controlled by a third clock signal (CK2~), and to the output register by pass transistors (P), which are controlled by a fourth clock signal (CK3~).

27 Claims, 2 Drawing Sheets

5,274,282

MONOSTABILIZED DYNAMIC PROGRAMMABLE LOGIC ARRAY IN CMOS TECHNOLOGY

This is a continuation of application Ser. No. 07/767,141, filed Sep. 27, 1991 now abandoned.

FIELD OF THE INVENTION

The present invention relates to a monostabilized dynamic programmable logic array in CMOS technology.

BACKGROUND OF THE INVENTION

As is known, in a typical programmable logic array executed in CMOS technology, the output lines of the input register enter vertically a so-called AND plane, the output lines of the AND plane enter horizontally a so-called OR plane, and the outputs of the OR plane exit vertically toward an output register. The horizontal lines of the AND plane are formed by transistors arranged in series and, where required by the combinatorial function, the transistors are controlled by the vertical lines so as to form an AND function. The horizontal output lines of the AND plane are connected to the supply voltage. In the OR plane, the vertical lines are the ones connected to the supply voltage, and the transistors arranged at the crossing points are controlled by the horizontal lines. The lines which enter and exit the AND plane are typically present in a normal version and in a complemented version in order to be able to obtain any required product term. A two-phase clock alternatively enables the input of the signals to the AND plane and the output of the signals from the OR plane.

SUMMARY OF THE INVENTION

The aim of the present invention is to provide a programmable logic array structure which allows a better exploitation of the silicon area, with a reduction in occupied space with respect to a programmable logic array having a conventional structure.

An object is to provide a programmable logic array so that its current consumption is markedly lower than that of an equivalent conventional programmable logic array.

The invention achieves this aim, this object and other objects and advantages, as will become apparent from the following description, with a CMOS programmable logic array, comprising an input register; an output register; a source of clock signals; an AND plane; and an OR plane.

The AND plane is formed by a plurality of vertical lines, controlled by the input register, and by a plurality of horizontal lines, which comprise normally-off transistors arranged in series. The horizontal lines are connected between a power supply voltage and the ground and are controlled by respective ones of said vertical lines. Specifically, the horizontal lines of the AND plane are connected toward the ground by normally-off transistors, which can be controlled by a first clock signal, and are connected toward the power supply voltage by normally-on transistors, which can also be controlled by the first clock signal.

The OR plane is formed by a plurality of horizontal lines, which are controlled by the horizontal lines of the AND plane, and by a plurality of vertical lines, which are connected between the power supply voltage and the output register. Each of the vertical lines of the OR plane contains one or more normally-off transistors which are controlled by respective ones of the horizontal lines of the OR plane.

The connections between the horizontal lines of the AND plane and the horizontal lines of the OR plane are formed by respective pairs of normally-on transistors and normally-off transistors arranged in series between the power supply voltage and the ground. The normally-on transistor in each pair is controlled by the horizontal line of the AND plane, and the normally-off transistor in each pair is controllable by a second clock signal. The horizontal line of the OR plane is connected to the node between the two transistors of the pair.

The connections between the vertical lines of the OR plane and the power supply voltage are formed by respective normally-on transistors which can be controlled by a third clock signal. The vertical lines of the OR plane can be connected to the output register through inverters and pass transistors, wherein the pass transistors can be controlled by a fourth clock signal.

BRIEF DESCRIPTION OF THE DRAWINGS

The invention is now described in greater detail with reference to a preferred embodiment, illustrated in the accompanying drawing, given by way of non-limitative example wherein.

DETAILED DESCRIPTION

Figure 1:
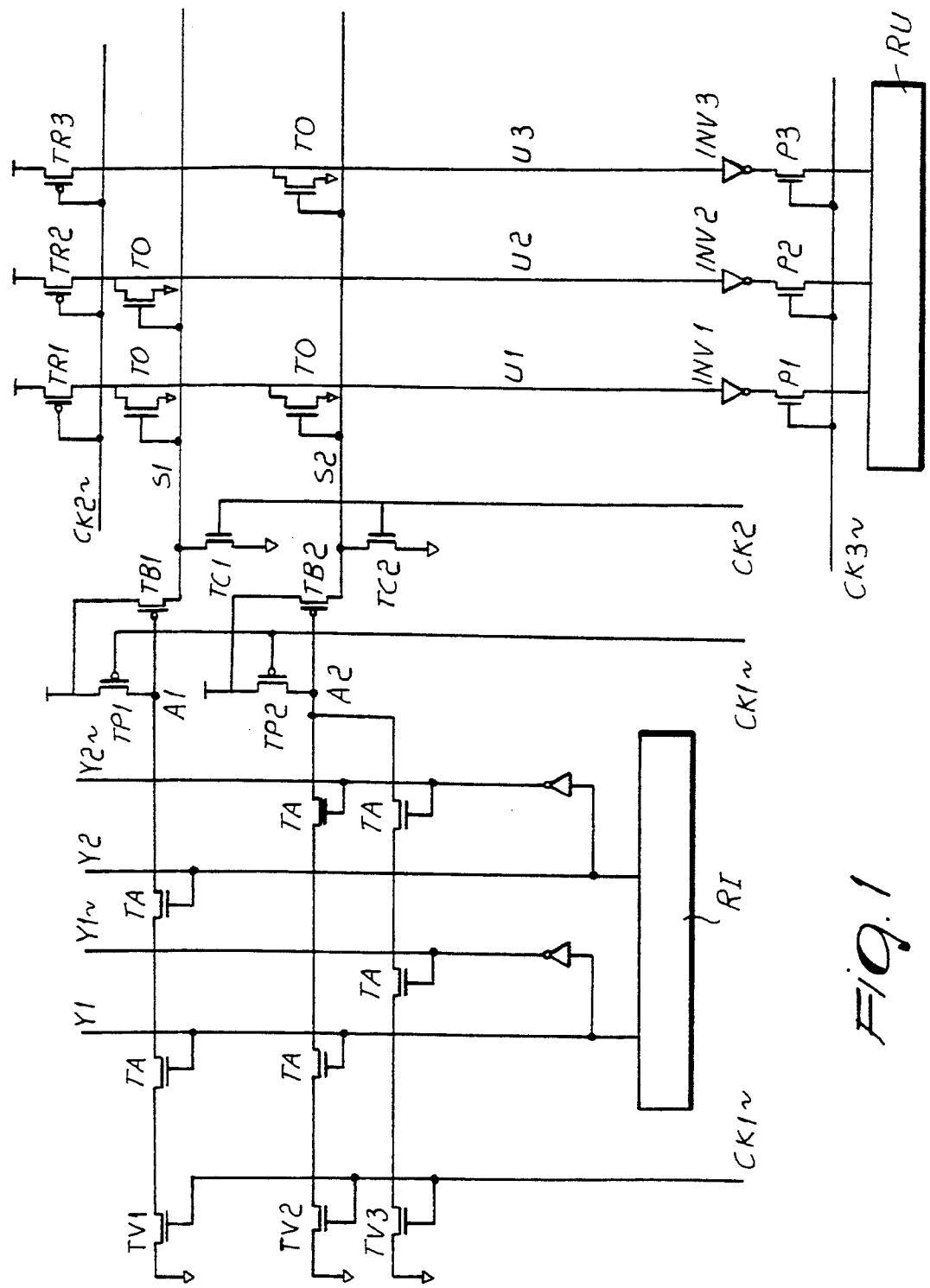
FIG. 1 is a partial circuit diagram of a programmable logic array according to a preferred embodiment of the invention.

With reference to FIG. 1, a per se known input register RI is adapted to receive input data on a plurality of lines and for driving a plurality of vertical lines Y1, Y1~, Y2, Y2~, ... which correspond to the input data and to their complements. The vertical lines Y1, Y1~, Y2, Y2~, intersect horizontal lines L1, L2, L3, ... constituted by a plurality of N-channel transistors TA arranged in series, so as to form a so-called AND plane. At the pseudo intersection points, the vertical lines Y1, Y1~, Y2, Y2~, ... are selectively connected to the gates of the transistors of the horizontal lines, according to the required programming of the logic array, as is known in the field. Each horizontal line L1, L2, L3, ... thus constitutes a NAND gate which is controlled by the bit lines connected thereto.

Each of the horizontal lines L1, L2, L3, ... of the AND plane has one terminal thereof connected to the ground by a respective N-channel evaluation transistor TV1, TV2, TV3, .... The gate of each of the N-channel evaluation transistors TV1, TV2, TV3, ... is controlled by a first clock signal CK1~. The opposite terminal of each horizontal line of the AND plane can be connected to the power supply voltage by means of a P-channel pre-loading transistor TP1, TP2, .... Where two adjacent horizontal lines of the AND plane are connected in parallel, as better explained hereinafter, the second terminal of each of the two horizontal lines can have a common output node such as A2, which is connected to the power supply voltage by a single P-channel pre-loading transistor TP2.

A second P-channel transistor TB1, TB2, ... is associated with each transistor TP1, TP2, ... respectively.

The source of the second P-channel transistor TB1, TB2, ... is at the power supply voltage and its gate is connected to the corresponding horizontal line of the AND plane. The gates of the transistors TP1, TP2, ... are all controlled by the same first clock signal CK1~ mentioned above. The drains of the transistors TB1, TB2, ... are connected to the ground by respective N-channel transistors TC1, TC2, ..., and the gates of the transistors TC1, TC2, ... are controlled in parallel by a second clock signal CK2.

The drains of all the transistors TB1, TB2, ... which copy the outputs of the NAND gates of the AND plane, constitute the horizontal input lines S1, S2, ... of an OR plane which also comprises vertical lines U1, U2, U3, .... A transistor TO can be present at each of selected pseudo intersections between the horizontal lines and the vertical lines of the OR plane, depending on the programming of the array. The gate of each transistor TO is controlled by the corresponding bit line S1, S2 .....

Each of the vertical lines U1, U2, U3, ... of the OR plane has one terminal connected to the power supply through a respective one of normally-on P-channel transistors TR1, TR2, TR3, ... The gates of the P-channel transistors TR1, TR2, TR3, ... are controlled by a third clock signal CK2~ which is complementary to the second clock signal CK2. The opposite terminal of each vertical line of the OR plane drives a respective inverter INV1, INV2, INV3, .... The output of each of the inverters INV1, INV2, INV3, ... is finally connected to an output register RU through a respective one of pass transistors P1, P2, P3, .... The gates of the pass transistors are controlled by a fourth clock signal CK3~.

The number of lines entering the OR plane is thus reduced. This situation allows the horizontal extraction of the outputs without increasing the occupied space.

The operation of the above described logic array is now described with reference also to FIG. 2, which plots the behavior of the four clock signals CK1~, CK2, CK2~, CK3~ with reference to a master clock signal CK which times the operation of the entire system.

Immediately after the descending front of the master clock signal CK, the descending front of the clock signal CK3~ disables the pass transistors P1, P2, P3, ... in order to transfer the previously read data item to the latches of the output register RU. Immediately thereafter, the clock signal CK1~ reaches zero and starts a phase for the pre-loading of the AND plane. The signal CK1~, being zero, opens the evaluation transistors TV1, TV2, TV3, ... and closes the pre-loading transistors TP1, TP2, ..., whereas the input data are applied to the lines Y1, Y1~, Y2, Y2~, ... and stabilized. Therefore the output A1, A2, ... of the horizontal lines of the AND plane which are enabled by the occurrence of the combination which selects them are preloaded.

The transistors TB1, TB2, being driven by the NAND gates, are off. The N-channel transistors TO are also switched off by the outputs of the AND plane (drains of the transistors TB1, TB2, ... ). The N-channel transistors TC for the pre-loading of the OR plane are also switched on due to the clock signal CK2 (which has a slight delay with respect to the signal CK1~ for disoverlapping reasons), whereas CK2~ simultaneously switches on the transistors TR1, TR2, ... as well. It can be seen that in this phase there is no static power consumption, since all the conducting paths between the power supply and the ground are open.

During the subsequent reading or evaluation phase, in which CK1~ has returned high, the horizontal output lines S1, S2, ... are connected to the ground by the transistors TC1, TC2, ..., because the transistors TA switch off on one side and the transistors TC1, TC2, ... switch off on the other side (except for the disoverlap between CK1~ and CK2), because of the clock signal CK1. At this stage, since the evaluation transistors TV1, TV2, TV3, ... have been switched on by the signal CK2, all the paths to the ground are enabled, allowing the preloaded AND lines to discharge. The sense transistors TB ensure the minimum switching threshold, and thus a rapid propagation. The selected lines S1, S2, ... are then loaded, and each one turns on the one or more transistors TO to which it is connected. The data are detected by inverters INV1, INV2, INV3, ... with a high threshold in order to ensure maximum performance.

By combining a plurality of NAND lines into a wired-OR configuration, according to the teachings of the invention, empty areas are created in the OR plane and allow the routing of the output to be less onerous by drawing said outputs at the required level. The wired-OR connections cause no deterioration in frequency performance, since in practice dynamic inversion circuits (inverters or NOR gates), formed by pairs of transistors TP and TR, are interposed between the AND plane and the OR plane. However, it is preferable to avoid exceeding the number of 4 wired-OR connected horizontal lines.

Figure 3:
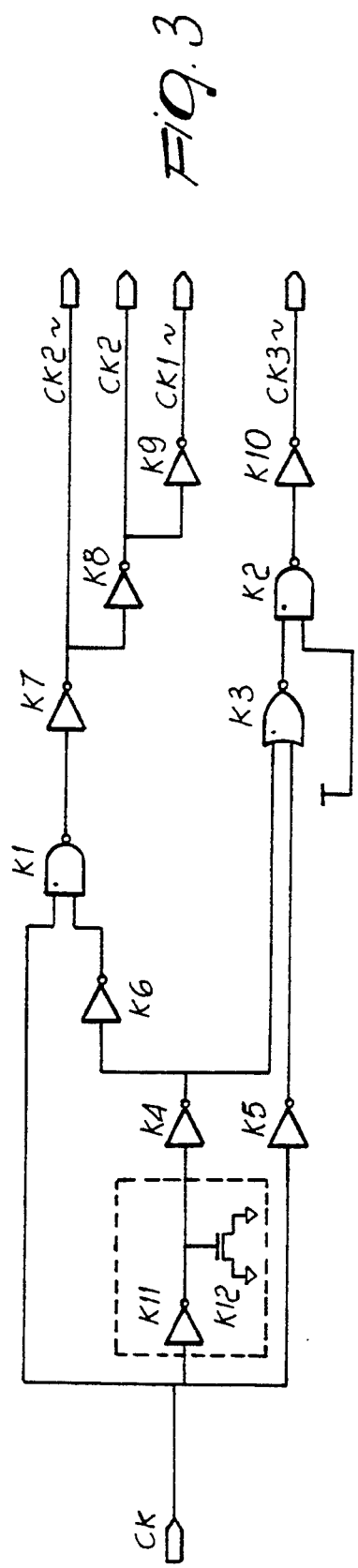
FIG. 3 is a diagram of a circuit for generating the clock signals of FIG. 2.

FIG. 3 illustrates a preferred circuit for generating four clock signals CK1~, CK2, CK2~, CK3~. The circuit is formed by two NAND gates K1, K2, by a NOR gate K3, a plurality of inverters K4, K5, K6, K7, K8, K9, K10 and by a delayed inverter circuit formed by an inverter K11 with a capacitor K12 connected to the ground. An input clock signal CK obtained from a master clock source drives the circuit.

Figure 2:
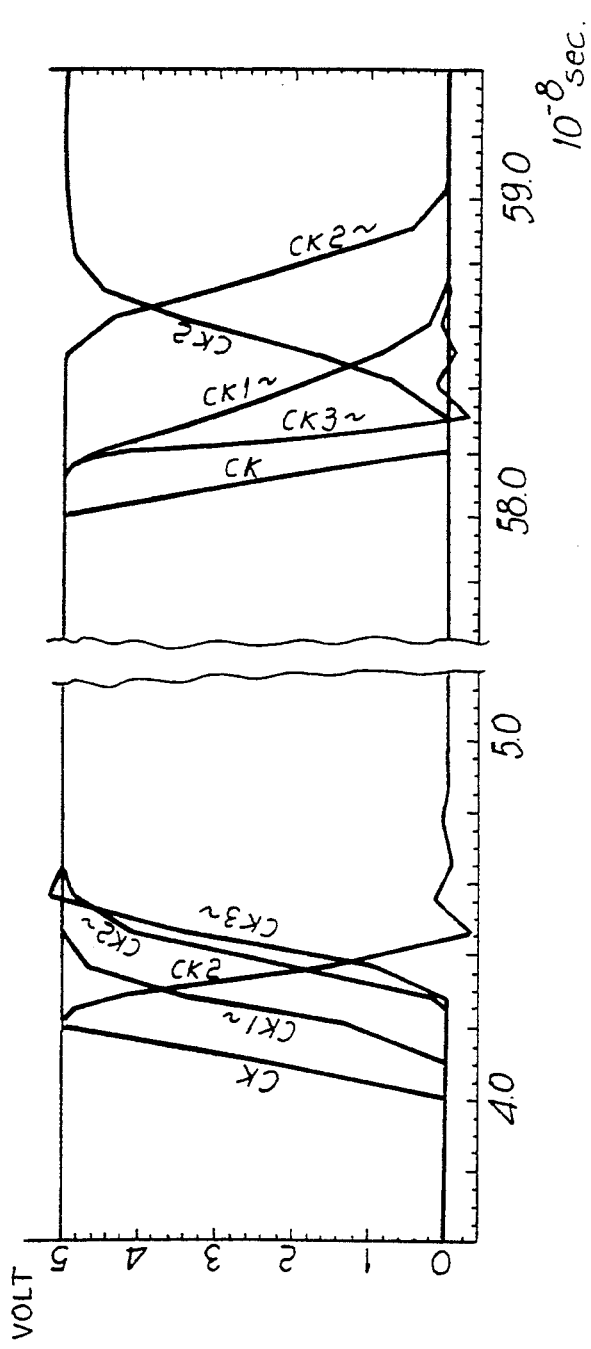
FIG. 2 is a plot of the clock signals used for the operation of the programmable logic array of FIG. 1.

The propagation constants of the various components, with appropriate size assignments which are obvious to the expert, generate the stepped phases of clock signals illustrated in FIG. 2. The delayed inverter ensures that the clock signal for the evaluation phase has a constant preset duration for any operating frequency of the system and in particular even at very low frequencies. After each evaluation, the array is thus immediately returned to the pre-loading phase, avoiding the leakage phenomena which would occur in case of prolonged performance in the evaluation phase and would corrupt the data item at low frequencies.

The terms "horizontal line", "vertical line", and "first, second, third and fourth lines" are expressions used for the sake of simplicity referring to the arrangement of the paths in FIG. 1, and have been used in the description and the claims only for easily distinguishing between the different classes of electric paths. Similarly, the term "plane" has been used to provide a simple designation of the association of the horizontal lines and the vertical lines of the AND arrangement or the OR arrangement, and such use does not imply that such association occurs in a geometrical plane. It should be furthermore noted that all the N-channel transistors are normally off in the illustrated circuit, i.e., they are off in the absence of signal on their gate, and must receive a high signal on their gate in order to be enabled, whereas the opposite is true in the case of P channel transistors.

The polarities of all the transistors in the circuit can therefore be reversed, if the polarity of the power supply voltage is also reversed.

A preferred embodiment of the invention has been described but it is understood that one skilled in the art may devise other modifications and variations which are comprised within the scope of the inventive concept.

We claim:

1. A CMOS programmable logic array comprising:
   an input register;
   an output register;
   at least one power supply voltage terminal;
   at least one reference voltage terminal;
   an AND plane formed by a plurality of first lines and a plurality of second lines, said plurality of first lines being controlled by said input register, each of said plurality of second lines having a first end node and a second end node, with the first end node of each respective one of said plurality of second lines being connected by a respective first transistor to a power supply voltage terminal, and the second end node of each respective one of said plurality of second lines being connected by a respective second transistor to a reference voltage terminal, each of said plurality of second lines containing a plurality of third transistors connected in series, the gate of each of the third transistors in a respective one of said plurality of second lines being connected to a respective selected one of said plurality of first lines;
   an OR plane formed by a plurality of third lines and by a plurality of fourth lines, each of said plurality of third lines being controlled by a respective one of said plurality of second lines, each of said plurality of fourth lines having a first end node and a second end node, the first end node of each respective one of said plurality of fourth lines being connected by a respective fourth transistor to a power supply voltage terminal, the second end node of each respective one of said plurality of fourth lines being connected to said output register, each of said plurality of fourth lines containing at least one fifth transistor, the gate of each fifth transistor in a respective one of said plurality of fourth lines being connected to a respective one of said plurality of third lines so that each said fifth transistor in a respective one of said plurality of fourth lines is controlled by a respective one of said plurality of third lines;
   the association between at least a respective one of said plurality of second lines and a respective one of said plurality of third lines being formed by a respective pair of a sixth transistor and a seventh transistor connected in series between a power supply voltage terminal and a reference voltage terminal, the gate of the sixth transistor in each pair being connected to at least a respective one of said plurality of second lines, the respective one of said plurality of third lines being connected to the node between the sixth and seventh transistors of the respective pair;
   a source of a first clock pulse signal connected to the gate of each of the first transistors and to the gate of each of the second transistors;
   a source of a second clock pulse signal connected to the gate of the seventh transistor in each pair; and
   a source of a third clock pulse signal connected to the gate of each of the fourth transistors.

2. A CMOS programmable logic array in accordance with claim 1, wherein said first, fourth, and sixth transistors are normally-on transistors, and wherein said second, third, fifth, and seventh transistors are normally-off transistors.

3. A CMOS programmable logic array in accordance with claim 2, wherein said source of a second clock pulse signal produces said second clock pulse signal to be complementary to said third clock pulse signal.

4. A CMOS programmable logic array in accordance with claim 3 said source of a second clock pulse signal and said source of a third clock pulse signal provide said second and third clock pulse signals such that at each operating cycle of the array the fronts of said second and third clock pulse signals are slightly delayed with respect to said first clock pulse signal.

5. A CMOS programmable logic array in accordance with claim 4 wherein the second end node of each respective one of said plurality of fourth lines is connected to said output register through a respective inverter and a respective pass transistor, and further comprising a source of a fourth clock pulse signal connected to the gate of each of the pass transistors for driving the transfer of the read data to said output register.

6. A CMOS programmable logic array in accordance with claim 5 wherein said power supply voltage terminal is positive, said normally-off transistors are N-channel transistors and said normally-on transistors are P-channel transistors.

7. A CMOS programmable logic array in accordance with claim 6 wherein said source of a first clock pulse signal, said source of a second clock pulse signal, said source of a third clock pulse signal, and said source of a fourth clock pulse signal are controlled by a master clock signal in order to generate said first, second, third, and fourth clock pulse signals.

8. A CMOS programmable logic array in accordance with claim 7 wherein second lines which correspond to logic product terms which yield an equal value on a preset output are connected to a power supply voltage terminal though a single first transistor in a wired OR configuration.

9. A CMOS programmable logic array in accordance with claim 6 further comprising a delayed inverter circuit having an input and an output, a source of a master clock pulse signal connected to the input of said delayed inverter circuit, and wherein said source of a first clock pulse signal, said source of a second clock pulse signal, and said source of a third clock pulse signal are controlled by the output of said delayed inverter circuit in order to generate said first, second and third clock pulse signals.

10. A CMOS programmable logic array in accordance with claim 9 wherein second lines which correspond to logic product terms which yield an equal value on a preset output are connected to a power supply voltage terminal though a single first transistor in a wired OR configuration.

11. A CMOS programmable logic array in accordance with claim 1, wherein said source of a second clock pulse signal produces said second clock pulse signal to be complementary to said third clock pulse signal.

12. A CMOS programmable logic array in accordance with claim 11 said source of a second clock pulse signal and said source of a third clock pulse signal provide said second and third clock pulse signals such that at each operating cycle of the array the fronts of said second and third clock pulse signals are slightly delayed with respect to said first clock pulse signal.

13. A CMOS programmable logic array in accordance with claim 1 said source of a second clock pulse signal and said source of a third clock pulse signal provide said second and third clock pulse signals such that at each operating cycle of the array the fronts of said second and third clock pulse signals are slightly delayed with respect to said first clock pulse.

14. A CMOS programmable logic array in accordance with claim 1 wherein the second end node of each respective one of said plurality of fourth lines is connected to said output register through a respective inverter and a respective pass transistor, and further comprising a source of a fourth clock pulse signal connected to the gate of each of the pass transistors for driving the transfer of the read data to said output register.

15. A CMOS programmable logic array in accordance with claim 14 wherein said source of a first clock pulse signal, said source of a second clock pulse signal, said source of a third clock pulse signal, and said source of a fourth clock pulse signal are controlled by a master clock signal in order to generate said first, second, third, and fourth clock pulse signals.

16. A CMOS programmable logic array in accordance with claim 15 wherein said power supply voltage terminal is positive, wherein said first, fourth, and sixth transistors are normally-on P-channel transistors, and wherein said second, third, fifth, and seventh transistors are normally-off N-channel transistors.

17. A CMOS programmable logic array in accordance with claim 1 wherein said power supply voltage terminal is positive, wherein said first, fourth, and sixth transistors are normally-on P-channel transistors, and wherein said second, third, fifth, and seventh transistors are normally-off N-channel transistors.

18. A CMOS programmable logic array in accordance with claim 1 wherein said source of a first clock pulse signal, said source of a second clock pulse signal, and said source of a third clock pulse signal are controlled by a master clock signal in order to generate said first, second and third clock pulse signals.

19. A CMOS programmable logic array in accordance with claim 1 further comprising a delayed inverter circuit having an input and an output, a source of a master clock pulse signal connected to the input of said delayed inverter circuit, and wherein said source of a first clock pulse signal, said source of a second clock pulse signal, and said source of a third clock pulse signal are controlled by the output of said delayed inverter circuit in order to generate said first, second and third clock pulse signals.

20. A CMOS programmable logic array in accordance with claim 1 wherein second lines which correspond to logic product terms which yield an equal value on a preset output are connected to a power supply voltage terminal though a single first transistor in a wired OR configuration.

21. An integrated circuit programmable logic array, comprising:
an AND plane, comprising a plurality of first lines, and a plurality of second lines, and a plurality of N-channel AND transistors located at some, but not all, pseudo-intersections of said first and second lines; wherein each said AND transistor is series-connected in one of said second lines and is controlled by one of said first lines;
an OR plane, comprising a plurality of third lines, and a plurality of fourth lines, and N-channel ground-connection transistors located at some, but not all, pseudo-intersections of said third and fourth lines; wherein each of said N-channel ground-connection transistors is interposed in one of said fourth lines and is controlled by one of said third lines;
each of said second lines being connected, at a first end thereof, to be pulled up by a respective P-channel precharge transistor which is connected to be controlled by a first clock phase;
each of said second lines being connected, at a second end thereof, to be pulled down by a respective N-channel evaluation transistor which is connected to be controlled by said first clock phase;
each of said third lines being connected to be pulled up by a respective P-channel transfer transistor which has a gate connected to said first end of at least one of said second lines;
each of said third lines being connected to be pulled down by a respective N-channel discharge transistor which is connected to be controlled by a second clock phase;
input circuitry connected to drive said first lines; and
output circuitry connected to sense the state of said fourth lines on the active phase of a third clock, which follows said second clock.

22. The integrated circuit of claim 21, wherein said output circuitry is connected to said fourth lines through N-channel transistors which are connected to be controlled by said third clock.

23. The integrated circuit of claim 21, wherein at least some of said second lines are connected together at said first end thereof, to a shared one of said precharge transistors and to the gate of a shared one of said transfer transistors.

24. The integrated circuit of claim 21, further comprising monostable clock generation circuitry which is connected to receive a master clock and to generate said first clock therefrom accordingly.

25. An integrated circuit programmable logic array, comprising:
an AND plane, comprising a plurality of first lines, and a plurality of second lines, and a plurality of N-channel AND transistors located at some, but not all, pseudo-intersections of said first and second lines; wherein each said AND transistor is series-connected in one of said second lines and is controlled by one of said first lines;
an OR plane, comprising a plurality of third lines, and a plurality of fourth lines, and N-channel ground-connection transistors located at some, but not all, pseudo-intersections of said third and fourth lines; wherein each of said N-channel ground-connection transistors is interposed in one of said fourth lines and is controlled by one of said third lines;
each of said second lines being connected, at a first end thereof, to be pulled up by a respective P-channel precharge transistor which is connected to be controlled by a first clock phase;
each of said second lines being connected, at a second end thereof, to be pulled down by a respective N-channel evaluation transistor which is connected to be controlled by said first clock phase;
each of said third lines being connected to be pulled up by a respective P-channel transfer transistor which has a gate connected to said first end of at least one of said second lines;

each of said fourth lines being connected to be pulled up by a respective P-channel precharge transistor which is connected to be controlled by the complement of a second clock phase;

each of said third lines being connected to be pulled down by a respective N-channel discharge transistor which is connected to be controlled by said second clock phase;

input circuitry connected to drive said first lines; and output circuitry connected to sense the state of said fourth lines;

wherein at least some of said first lines are connected together at said second end thereof, to a shared one of said precharge transistors, and to the gate of a shared one of said transfer transistors.

26. The integrated circuit of claim 25, wherein said output circuit is connected to sense the state of said fourth lines only on the active phase of a third, clock which follows said second clock.

27. The integrated circuit of claim 25, further comprising monostable clock generation circuitry which is connected to receive a master clock and to generate said first clock therefrom accordingly.

* * * * *